(12) United States Patent
Nishimura et al.

(10) Patent No.: US 6,476,387 B1
(45) Date of Patent: Nov. 5, 2002

(54) METHOD AND APPARATUS FOR OBSERVING OR PROCESSING AND ANALYZING USING A CHARGED BEAM

(75) Inventors: Norimasa Nishimura, Yokohama (JP); Akira Shimase, Yokosuka (JP); Junzou Azuma, Ebina (JP); Yuichi Hamamura, Yokohama (JP); Michinobu Mizumura, Yokohama (JP); Yasuhiro Koizumi, Sayama (JP); Hidemi Koike, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/311,268

(22) Filed: May 14, 1999

(30) Foreign Application Priority Data

May 15, 1998 (JP) ............................................. 10-132946

(51) Int. Cl.[7] ............................................... H01J 37/30
(52) U.S. Cl. ..................... 250/306; 250/307; 250/310; 250/398; 250/504 R; 250/492.2; 250/492.3; 430/296; 430/273.1
(58) Field of Search ................................. 250/306, 307, 250/310, 398, 504 R, 492.2, 492.3; 430/296, 273.1

(56) References Cited

U.S. PATENT DOCUMENTS 5,441,849 A * 8/1995 Shiraishi et al. ............ 430/296
5,591,970 A * 1/1997 Komano et al. ............ 250/309

FOREIGN PATENT DOCUMENTS

JP 61248346 11/1986

OTHER PUBLICATIONS

Japanese Patent Abstract No. 1–243449 published Sep. 28, 1989.
Japanese Patent Abstract No. 57–170526 published Oct. 20, 1982.
Japanese Patent Abstract No. 1–119668 published May 11, 1989.

* cited by examiner

Primary Examiner—John R. Lee
Assistant Examiner—Nikita Wells
(74) Attorney, Agent, or Firm—Antonelli, Terry, Stout & Kraus, LLP

(57) ABSTRACT

In a method for observing or processing and analyzing the surface of a sample by irradiating a charged beam on the sample covered at least partially by an insulator film, an ultraviolet light is irradiated possibly as pulse on the sample (substrate), thereby transforming the insulator into a conductive material due to the photoconductivity effect, thereby transforming the surface of the sample (substrate) into a conductive material, so that charged particles are grounded from a grounded portion in order to prevent the charged beam from being repulsed due to charged particles of the irradiated charged beam accumulated in the insulator formed on the surface of the sample (substrate).

22 Claims, 9 Drawing Sheets

METHOD AND APPARATUS FOR OBSERVING OR PROCESSING AND ANALYZING USING A CHARGED BEAM

BACKGROUND OF THE INVENTION

The present invention relates to a method and an apparatus for observing or processing and analyzing substrates with an insulator formed thereon using a charged beam; and; more particularly, the invention relates to a method and an apparatus of the type described, which can prevent charged particles from accumulating in an insulator irradiated by the charged beam, as well as to detect secondary electrons generated from those substrates as secondary particles.

At present, a charged beam is used for observing or analyzing and processing minute areas on LSI circuits, masks, etc. However, the method and apparatus used heretofore for such objects have experienced a problem in that, when observing or analyzing and processing substrates with an insulator formed thereon using a charged beam, the charged particles of the irradiated charged beam are accumulated (charging up) on the surface of the object insulator, with a result that the charged beam is repulsed, causing the irradiation point of the charged beam to be shifted, thereby disabling the observation or analysis and processing of the substrate. On the other hand, there is a conventional method that uses an ion beam to achieve the above-described operations, as disclosed in the official gazette of Japanese Patent Laid-Open No. 61-248346. According to this method, an electron shower is irradiated in the ion beam irradiation area, thereby neutralizing electrons which may have accumulated on the surface of the object substrate. The surface of the substrate can thus be observed, analyzed, and processed using a scanning ion microscope image obtained by detecting secondary ions ejected from the substrate during ion beam irradiation.

Since the above conventional technique uses an electron shower, it is impossible to obtain images from secondary electrons detected as secondary particle images. Consequently, the surface of the object substrate can be observed only by images obtained from secondary ions detected as described above. Furthermore, this case also experiences a problem in that high contrast images cannot be obtained, since the amount of secondary ions is as low as a few percent of the primary ions. This is why the positioning accuracy during irradiation of the charged beam is lowered. On the other hand, the official gazettes of the Japanese Patent Laid-Open No. 1-119668, No. 57-170526, and No. 1-243449 have disclosed methods of preventing the above-mentioned problems. According to those methods, the insulator formed on the object substrate is transformed into a conductive material by exciting the electrons therein optically so as to prevent a charging-up from occurring in the insulator. And accordingly, this method makes it possible to obtain images with secondary electrons detected as images of secondary particles.

The official gazette of the Japanese Patent Laid-Open No. 1-119668 has also disclosed a method of irradiating the substrate with an ultraviolet beam having a difference of energy between the conductor bands of Si and SiO2 or a difference of energy between valence bands. According to this method, an energy must be injected in the interface between Si and SiO2 It is thus impossible to use a short wavelength light that cannot pass through SiO2. In addition, it is also difficult to apply the method to substrates, which tend to block the light applied to the interface due to having a light-proof film, such as a mask, etc., as well as substrates which are not made of a conductive material.

Another method of preventing the surface of a light-exposed substrate from charging-up is disclosed in the official gazette of Japanese Patent Laid-Open No. 57-170526. According to this method, an organic semiconductor provided with optical conductivity is used or a semiconductor provided with optical conductivity is coated on the object resist. This method also includes problems in that a coating process is needed, as well as the fact that the kinds of samples which are capable of use are limited; and so, the method cannot be used for masks, and the like.

The official gazette of Japanese Patent Laid-Open No. 1-243449 has disclosed another method of preventing such charging-up. According to this method, light for exciting the object insulator is applied obliquely, so charging-up is apt to occur at portions on the substrate which are not irradiated by the light due to the projections and depressions formed thereon. In addition, it is also difficult for this method to prevent charging-up at samples covered completely by an insulator and isolated mask patterns even when the electrons in the insulator are excited, since there is no concrete method for grounding the charged electrons.

SUMMARY OF THE INVENTION

Under such circumstances, it is an object of the present invention to provide a method and an apparatus with which it is possible to observe or analyze and process respective substrates with an insulator formed thereon accurately and easily by solving the above-described conventional problems.

What makes it difficult to observe images of secondary particles on a substrate with an insulator formed thereon is charged particles that are not grounded, but are accumulated (charging-up) in the insulator. And, those accumulated charged particles cause the irradiated charged beam to be repulsed.

This is why it is considered to be possible to prevent such the charging-up if the surface of the substrate is transformed into a conductive material and grounded. And, the present invention has achieved this object by irradiating a light having a wavelength for exciting the electrons in the insulator on the object substrate, thereby transforming the insulator into a conductive material due to the photoconductivity effect, and then grounding the charged particles from the grounded surface.

The present invention has also achieved the above objects by employing a method that uses a charged beam and includes the following steps. Concretely, the method includes a step of placing a sample covered at least partially by an insulator film on a sample stage provided in a sample chamber, a step of irradiating light, possibly as pulses on the surface of the sample while the sample is placed on the sample stage and the sample chamber is evacuated, a step for irradiating the charged beam on the surface of the sample, a step of irradiating a light like pulses in an area ranged from a charged beam irradiation portion to the surface of a member grounded in the sample chamber so as to excite electrons in the material composing the insulator film, a step of detecting secondary particles generated from the surface of the sample irradiated by the charged beam, and a step of observing, processing, or analyzing the surface of the sample according to information provided by the secondary particles detected in the preceding step.

The present invention has also achieved the above objects by employing a method that uses a charged beam and includes the following steps. Concretely, the method includes a step of placing a sample covered at least partially by an insulator film on a sample stage provided in a sample chamber, a step of irradiating light, possibly as pulses on the surface of the sample while the sample is placed on the sample stage and the sample chamber is evacuated, a step for irradiating the charged beam on the surface of the sample, a step of irradiating a light like pulses in an area ranged from a charged beam irradiation portion to the surface of a member grounded in the sample chamber so as to excite the electrons in the material composing the insulator film, a step of detecting secondary particles generated from the surface of the sample irradiated by the charged beam, and a step of observing, processing, or analyzing the surface of the sample according to information provided by the secondary particles detected in the preceding step.

Furthermore, the present invention has also achieved the above objects with an apparatus that uses a charged beam and includes the following components. Concretely, the apparatus of the present invention comprises a charged beam source for emitting a charged beam, a focusing optical system for irradiating the charged beam on the sample by focusing a charged beam emitted from the charged beam source, a stage for holding the sample thereon, secondary particle detecting means for detecting secondary particles generated from the sample irradiated by the charged beam focused by the optical focusing means, and irradiating means for irradiating ultraviolet light, possibly as pulses, on the surface of the sample.

Furthermore, the present invention has achieved the above objects with an apparatus that uses a charged beam and includes the following components. Concretely, the apparatus of the present invention comprises a sample chamber provided with a sample stage on which a sample is placed, evacuating means for evacuating the sample chamber, a charged beam source for emitting a charged beam, a focusing optical system for focusing the charged beam emitted from the charged beam source, thereby irradiating a focused charged beam on the sample placed on the sample stage, secondary particle detecting means for detecting secondary particles generated from a sample irradiated by the charged beam focused by the optical focusing system, and ultraviolet light irradiating means for irradiating ultraviolet light, possibly as pulses, in an area ranged from a charged beam irradiation portion on the surface of the sample to the surface of a member grounded in the sample chamber.

According to the present invention, therefore, it is easy to observe, process, and analyze substrates with an insulator formed thereon. Especially, it is possible to detect and correct defects on phase shifting masks. Furthermore, even for substrates composed of only an insulator, it is possible to observe, process, and analyze those substrates if a grounded probe or conductor exists in the light irradiation area and is in contact with the substrate.

BRIEF DESCRIPTION OF THE DRAWINGS

FIGS. 1(a) and 1(b) are diagrammatic views of the apparatus for performing the correcting method in accordance with the first embodiment of the present invention; wherein, FIG. 1(a) is a schematic front across sectional view of the apparatus of the present invention, and FIG. 1(b) is an expanded view of a portion of FIG. 1(a).

DESCRIPTION OF THE PREFERRED EMBODIMENTS

Hereunder, the preferred embodiments of the present invention will be described with reference to the accompanying drawings, which embodiments will be described individually for simplifying the description.

<First Embodiment>

Figure 1A:
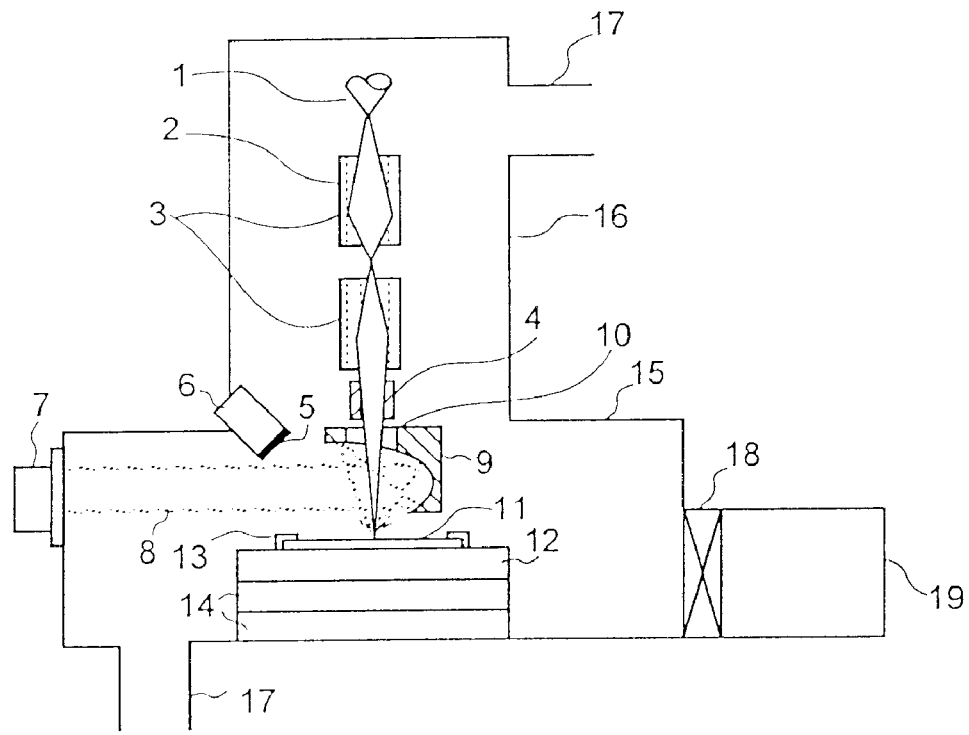

FIG. 1(a) shows the first embodiment of the present invention. In this embodiment, an ion beam is used as a charged beam and a phase shifting mask is used as a sample provided with an insulator formed thereon.

In FIG. 1(a), in an ion beam chamber 16 there is provided an ion beam optical system comprising an ion source 1, a lens 3 for focusing an ion beam 2 emitted from, for example, both a Ga and ion source 1, and a deflecting electrode 4 for deflecting the ion beam 2. Those components of the optical system are powered by a power supply and controlled by a controller (both not illustrated). The ion beam chamber 16 is evacuated by an evacuating apparatus through an evacuation tube 17.

In a process chamber 15 there are provided a holder 12 for holding a sample 11, a clamp 13 for clamping the sample 11, an XY stage 14 for moving the sample 11 to a given position, a scintillator 5 for detecting secondary particles ejected from the sample irradiated by the ion beam 2, a secondary particle detector 6 comprising a photoelectron multiplier, and a reflecting mirror 9 for irradiating light 8 for exciting the electrons in an insulator formed on the sample 11. The light 8 is emitted from the exciting light source 7 attached to the process chamber 15 and is irradiated on the sample in a uniform manner. The reflecting mirror 9 is provided with a hole 10 through which the ion beam is passed. The process chamber 15 is evacuated by an evacuating apparatus (not illustrated) through the evacuation tube 17.

A reserved chamber 19 is connected to the process chamber 15 through a gate valve 18, and the reserved chamber 19 is structured so as to guide a holder 12 onto the XY stage 14 using a transfer device (not illustrated).

Figure 1B:
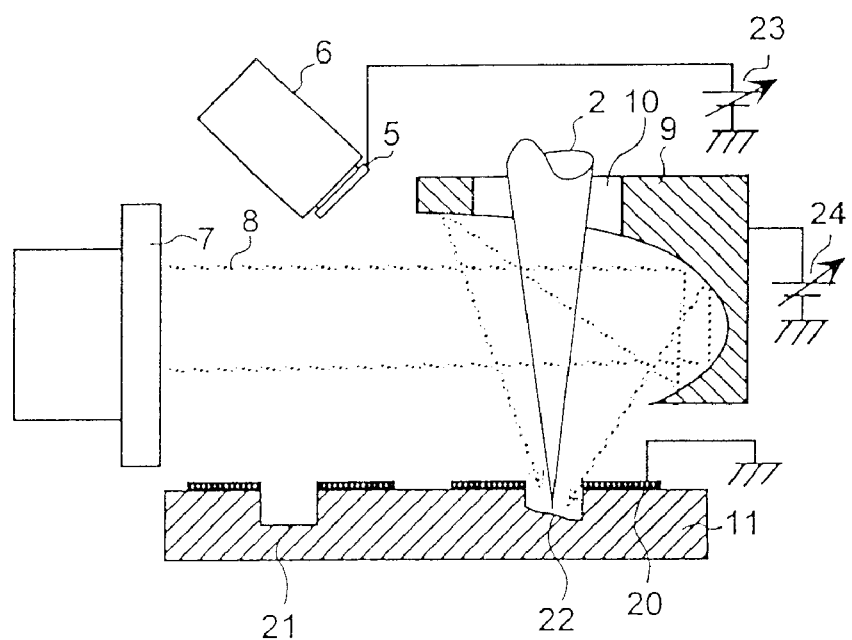

Hereunder, a method of observing a processing substrates with an insulator formed thereon using the apparatus in this example will be described more in detail with reference to FIG. 1(b). FIG. 1(b) shows a detailed view of an area where the ion beam is irradiated. In FIG. 1(b), numeral 20 denotes a conductive light-proof film, 21 denotes a phase shifter, 22 denotes a defect, 23 denotes a power supply for applying a voltage to the scintillator 5, and 24 denotes a power supply for applying a voltage to the reflecting mirror. For example, if the defect 22 is detected on the phase shifter 21 provided in the phase shifting mask, the phase amplitude of the light that passes the defect portion is shifted significantly. When the ion beam 2 is used to correct this defect, therefore, a defect 22 is detected at first using the defect inspecting device. Then, the possible defect position is moved to a location just under the light axis of the ion beam 2 according to the coordinate data which identifies the defect position. After this, the light 8 for exciting the electrons in the object insulator is irradiated on the defect 22 from the light source 7.

The light 8 for exciting the electrons in the insulator is irradiated in a uniform manner in the ion beam irradiation area in the same axial direction as that of the ion beam. In addition, the light 8 can be irradiated up to the conductive light-proof film 20, which is grounded by a substrate holder, and thereby the electrons in the insulator region are grounded. The insulator formed on the transparent substrate 11 provided with insulation properties is transformed into a conductive material, since the electrons in the valence band are excited up to a conductor band. Consequently, the charged particles in the irradiated ion beam 2 are not accumulated in the insulator; rather, they are ejected up to the grounded portion. After this, the secondary particles discharged from the surface of the substrate are detected by the secondary particle detectors 5 and 6 when the ion beam 2 is scanned on the substrate. The scanning ion image can thus be observed.

In this case, if a voltage is applied on the reflecting mirror 9 and the surface of the substrate is made of a material having a large probability for ejecting secondary particles, the secondary particles can be amplified using the reflecting mirror 9 to which a voltage is applied.

If the intensity of the light 8 for exciting the electrons in the insulator is varied with time, secondary particles can be detected more effectively using the secondary particle detectors 5 and 6 by adjusting those detectors 5 and 6 to the varying intensity of the light 8. And, according to the scanning ion image obtained above, the position of the defect 22 of the phase shifter is detected, the irradiation area of the ion beam 2 is set, and the ion beam 2 is irradiated only on the defect portion, thereby removing or correcting the defect 22. In addition, if the wavelength of the light 8 for exciting the electrons in the insulator can excite the transparent substrate 11 provided with insulation properties and the substrate 11 is made of quartz, an ultraviolet light should preferably be used at a wavelength of 150 nm or under.

<Second Embodiment>

Figure 2:
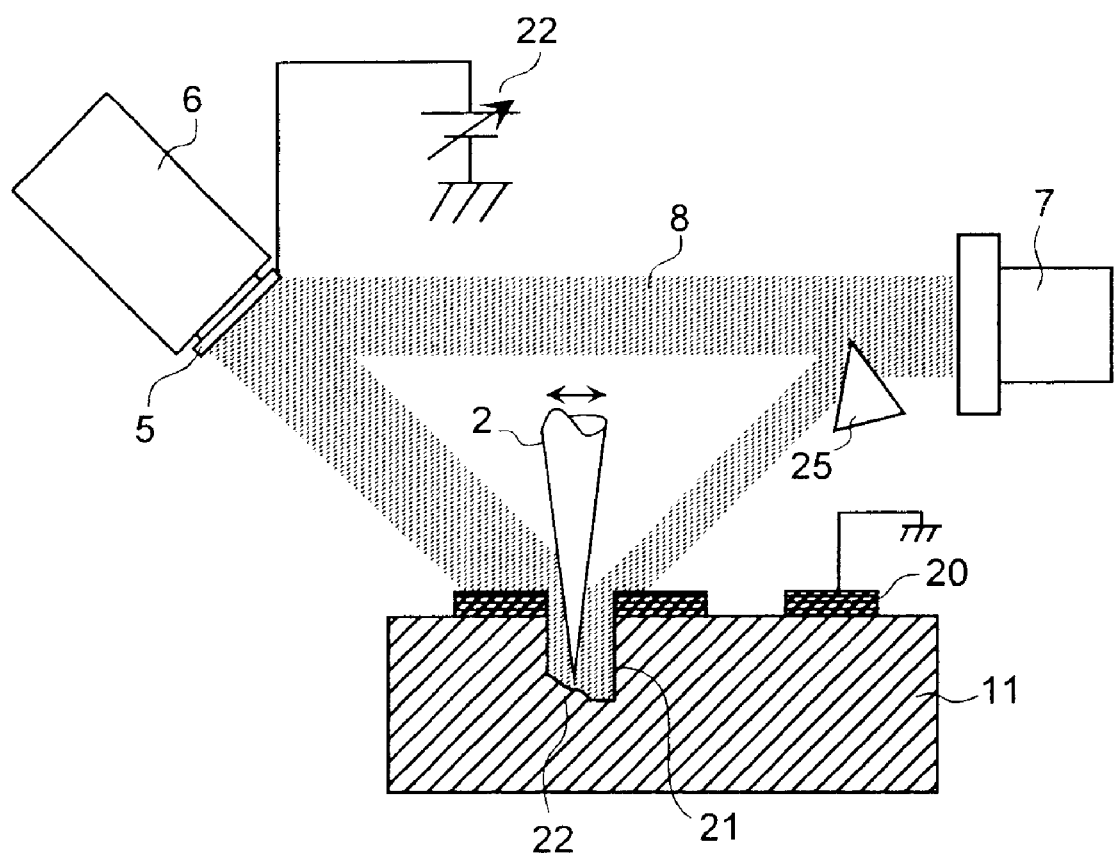
FIG. 2 is a schematic front view showing the relationship among a sample, a beam source, and a photoelectric multiplier in an apparatus employing the correcting method in accordance with the second embodiment of the present invention.

The second embodiment of the present invention involves a method of detecting and correcting defects of a phase shifter by irradiating light for exciting the electrons in the object insulator on each defect from two directions. Hereunder, the method will be described with reference to FIG. 2. In FIG. 2, numeral 25 denotes a prism. Just like the first embodiment, an ion beam 2 is used for correcting defects. At first, the position of an object defect is detected using a defect inspecting unit, and according to the coordinate data which identifies the defect position, the possible position of the defect 22 is moved to a location just under the light axis of the ion beam 2. Then, the light 8 for exciting the electrons in the object insulator is irradiated from the light source 7. Part of the light 8 enters the prism 25 and the rest of the light 8 is directed to the scintillator 5. The light 8 which enters the prism 25 is then deflected so as to be irradiated on the ion beam irradiation area.

The light irradiated onto the scintillator 5 is reflected by the reflecting film formed on the surface of the scintillator 5, so that the light is irradiated in the ion irradiation area from a direction different from that of the light irradiated from the prism 25. The light 8 is irradiated up to the conductive light-proof film 20 grounded by the substrate holder, and thereby the electrons in the insulator are grounded. The insulator formed on the transparent substrate 11 provided with insulation properties is transformed into a conductive material due to the irradiation of the light 8, as in the first embodiment, so that the charged particles of the ion beam 2 are not accumulated in the insulator; rather, they are ejected up to the grounded portion. After this, the secondary particles ejected from the surface of the substrate are detected by the secondary particle detectors 5 and 6 when the ion beam 2 is scanned on the substrate. The scanning ion image can thus be observed.

The position of the defect 22 of the phase shifter is detected from this scanning ion image. The ion beam 2 is then irradiated only on this defect portion, thereby removing or correcting the defect 22. In addition, if the wavelength of the light 8 for exciting the electrons in the insulator can excite the transparent substrate 11 provided with insulation properties and the substrate 11 is made of quartz, an ultraviolet light should preferably be used at a wavelength of 150 nm or under. The scintillator 5 should not react with the light 8.

<Third Embodiment>

Figure 3:
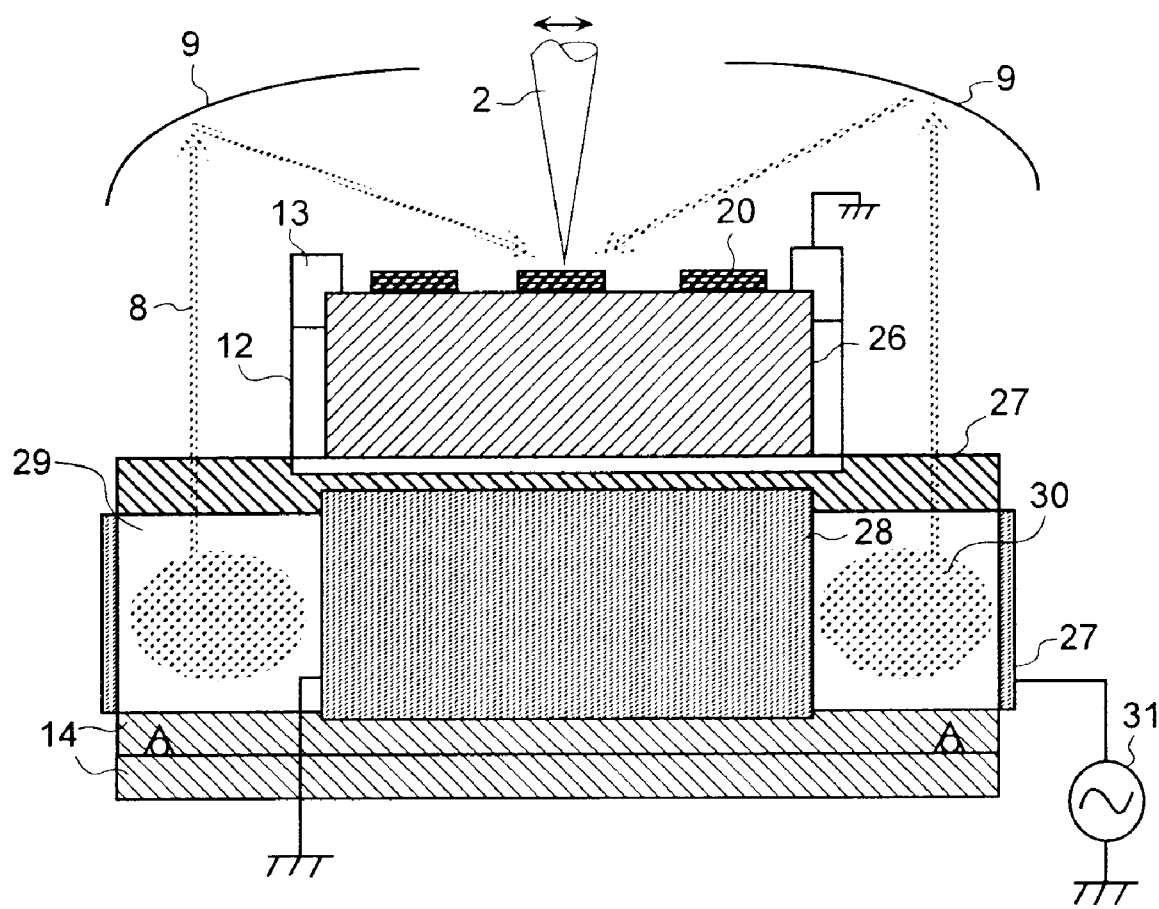
FIG. 3 is a schematic front cross sectional view of a sample and the area around the sample in an apparatus employing the method for observing, processing, and analyzing in accordance with the third embodiment of the present invention.

The third embodiment of the present invention is shown in FIG. 3. In this embodiment, an ion beam is used as a charged beam and light generated from a plasma is irradiated on the sample provided with insulation properties from many directions, thereby observing, processing, and analyzing the sample. In FIG. 3, numeral 26 denotes a sample provided with insulation properties, 27 denotes a light transmission material that transmits light for exciting an object insulator, 28 denotes an electrode for generating a plasma, 29 denotes a plasma chamber, 30 denotes a plasma having a wavelength for exciting the electrons in the object insulator, and 31 denotes a high frequency power supply. Because secondary particle images are also shifted by charging-up even on the surface of the object insulator, other than a phase shifting mask, an ion beam 2 is used for observing, processing, and analyzing the sample in this embodiment, just like in the above embodiments.

At first, the object portion for observing, processing, and analyzing is moved to a location just under the light axis of the ion beam 2, and then the plasma 30 is ignited in the plasma chamber 29 just under the sample 26 provided with insulation properties. The plasma chamber 29 can be moved by the XY stage 14 together with the substrate holder. The light 8 emitted from the plasma 30 and used for exciting the electrons in the insulator is transmitted through the light transmission substance 27 just under the sample 26, and then the light 8 is reflected by the reflecting mirror 9 fixed to the chamber so as to be irradiated on the ion beam irradiation area. The light 8 irradiated from many directions is irradiated up to the conductive thin film 20 grounded by the substrate holder, thereby grounding the charged particles. The sample 26, just like in the above embodiments, is transformed into a conductive material due to the irradiation of the light 8, so that the charged ions in the irradiated ion beam 2 are not accumulated in the insulator; rather, they are ejected up to the grounded portion.

After this, the ion beam is scanned on the substrate, thereby detecting the secondary particles ejected from the surface of the substrate using the secondary particle detectors and observing the scanning ion image. This ion image makes it possible to observe, process, and analyze a desired area. The wavelength of the light 8 used here for exciting the electrons in the insulator can also excite the sample 26 having insulation properties. Although the plasma 30 used as an exciting light source is placed at the back side of the sample 26 in FIG. 3, the plasma chamber 29 may be placed on top of the sample 26, so that the light 8 emitted from the plasma 30 and used for exciting the electrons in the object insulator is irradiated on the surface of the sample 26, unless the chamber 29, when placed there, affects the observation and processing carried out using a charged beam. The substances that transmit the above light 8 are MgF2, Life, etc.

<Fourth Embodiment>

Figure 4:
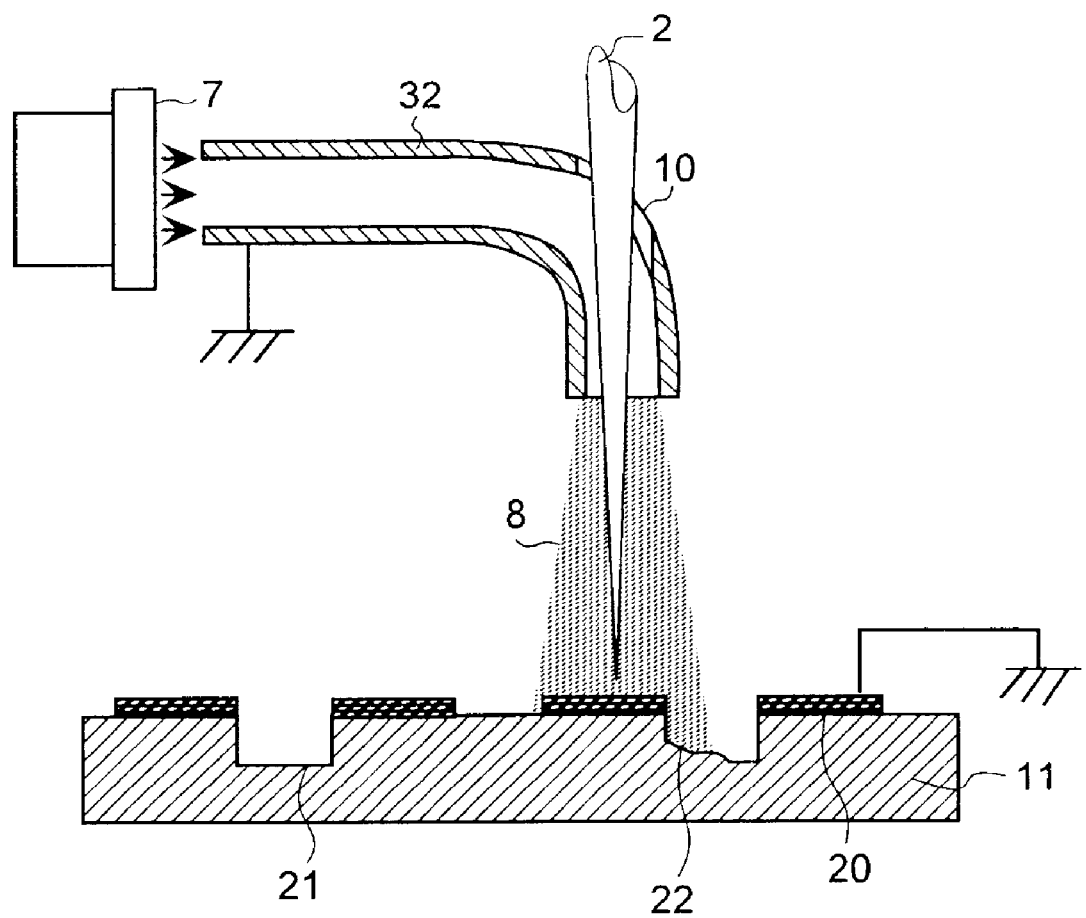
FIG. 4 is a schematic front cross sectional view of a sample and the area around the sample in an apparatus employing the correcting method in accordance with the fourth embodiment of the present invention.

The fourth embodiment of the present invention involves a method of irradiating light for exciting the electrons in an object insulator on defects of a phase shifting mask along the same axis as that of the charged beam using a CARAT scope. Hereunder, the method in the fourth embodiment will be described with reference to FIG. 4. In FIG. 4, numeral 32 denotes a CARAT scope. Just like in the above embodiments, an ion beam 2 is used for correcting defects. At first, the position of the object defect 22 is detected using a defect inspecting unit, and then, according to the coordinate data which identifies the detected defect position, the possible position of the defect 22 is moved to a location just under the light axis of the ion beam 2. Then, the light 8 emitted from the light source 7 and used for exciting the electrons in an object insulator is irradiated on the sample. The light 8 is then irradiated in the ion beam irradiation area along the same axis as that of the ion beam 2 using the CARAT scope 32. The CARAT scope 32 is provided with a hole for passing the ion beam 2, so that the ion beam 2 is irradiated on a given portion on the surface of the sample through this hole.

The light 8 for exciting the electrons in the object insulator is irradiated up to the conductive light-proof film 20 grounded by the substrate holder, thereby grounding the charged particle in the insulator. The insulator formed on the transparent substrate provided with insulation properties, as in the above embodiments, is transformed into a conductive material due to the irradiation of the light 8, so that the charged particles of the ion beam 2 are not accumulated in the insulator; rather, they are ejected up to the grounded portion. After this, the ion beam 2 is scanned on the sample, whereby the secondary particles ejected from the surface of the substrate are detected by the secondary particle detectors and the ion scanning image can be observed. The position of the defect 22 of the phase shifter is detected from this scanning ion image. The ion beam 2 is irradiated only on this defect portion, thereby removing or correcting the defect 22. In addition, if the wavelength of the light 8 for exciting the electrons in the insulator can excite the insulating transparent substrate 11 and the substrate 11 is made of quartz, an ultraviolet light should preferably be used at a wavelength of 150 nm or under.

<Fifth Embodiment>

Figure 5:
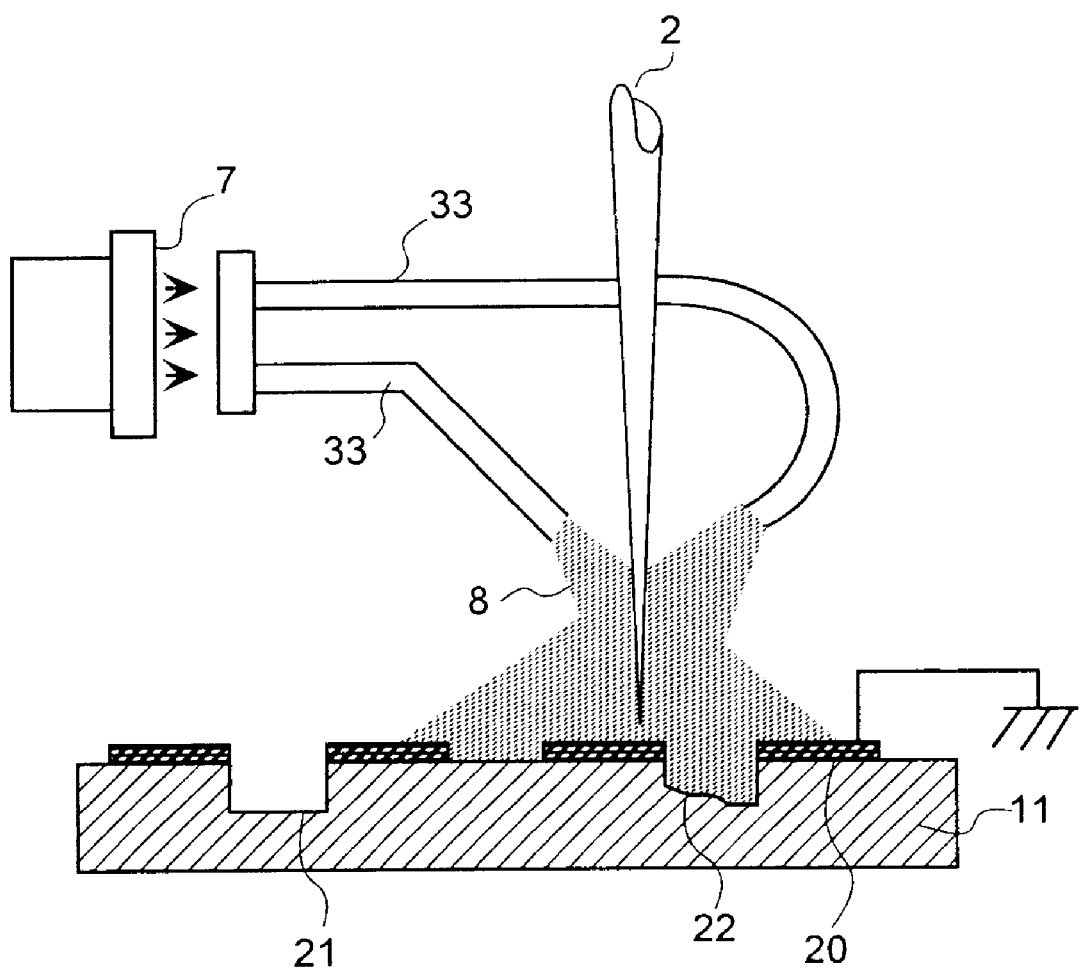
FIG. 5 is a schematic front cross sectional view of a sample and the area around the sample in an apparatus employing the correcting method in accordance with the fifth embodiment of the present invention.

The fifth embodiment of the present invention involves a method of irradiating light for exciting the electrons in an object insulator on defects of a phase shifting mask from many directions using optical fibers. Hereunder, the method used in the fifth embodiment will be described with reference to FIG. 5. In FIG. 5, numeral 33 denotes optical fibers. Just like in the above embodiments, an ion beam 2 is used for correcting defects. At first, the position of the object defect 22 is detected using a defect inspecting unit, and then, according to the coordinate data of the detected defect position, the possible position of the defect 22 is moved to a location just under the light axis of the ion beam 2. Then, the light 8 emitted from the light source 7 and used for exciting the electrons in the object insulator is irradiated on the sample.

The light 8 emitted from the light source 7 and used for exciting the electrons in the object insulator is then branched into optical fibers 33, so that the light 8 is irradiated in the ion beam irradiation area from many directions through those optical fibers. The light 8 is irradiated up to the conductive light-proof film 20 grounded by the substrate holder, thereby grounding the charged particles in the insulator. The insulator formed on the transparent substrate provided with insulation properties, just like in the above embodiments, is transformed into a conductive material due to the irradiation of the light 8, so that the charged particles of the ion beam 2 are not accumulated in the insulator; rather, they are ejected up to the grounded portion. After this, the ion beam 2 is scanned on the sample, so that the secondary particles discharged from the surface of the substrate are detected by the secondary particle detectors and the ion scanning image can be observed. The defect 22 of the phase shifter is detected from this scanning ion image. The ion beam 2 is then irradiated only on this defect portion, thereby removing or correcting the defect 22. In addition, if the wavelength of the light 8 for exciting the electrons in the insulator can excite the insulating transparent substrate 11 and the substrate 11 is made of quartz, an ultraviolet light should preferably be used at a wavelength of 150 nm or under.

<Sixth Embodiment>

Figure 6:
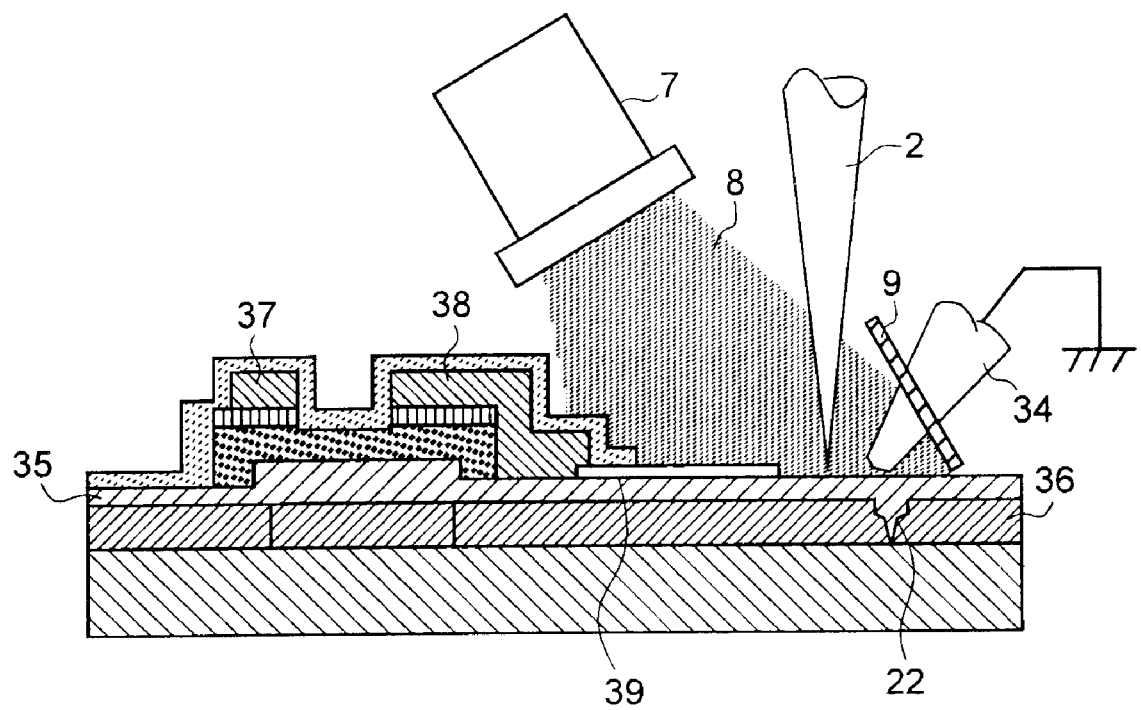
FIG. 6 is a schematic front cross sectional view of a sample and the area around the sample in an apparatus employing the correcting method in accordance with the sixth embodiment of the present invention.

The sixth embodiment of the present is shown in FIG. 6. In this embodiment, an ion beam is used as the charged beam described above and a liquid crystal TAFT substrate is used as a sample with an insulator formed thereon. In FIG. 6, numeral 34 denotes a probe, 35 denotes an insulator film, and 36 denotes a gate line. Reference numerals 37 and 38 denote data lines, and 39 denotes a transparent dot electrode. If a break failure 22 occurs in part of the data line or gate line of the liquid crystal TAFT substrate used for a projector, etc., whose size per one pixel is small, the TAFT substrate causes a line defect. The ion beam 2 is used for detecting the defect 22. At first, the position of the object defect 22 is detected using a defect inspecting unit, and then, according to the coordinate data which identifies the detected defect position, the possible position of the defect 22 is moved to a location just under the light axis of the ion beam 2. Then, the light 8 emitted from the light source 7 and used for exciting the electrons in the object insulator is irradiated in the ion beam irradiation area.

Part of the light 8 emitted from the light source 7 and used for exciting the electrons in the object insulator is reflected by the reflecting mirror 9 attached to the probe 34, and then is irradiated in the ion irradiation area from the direction in which it is deflected by the reflection mirror 9. Grounding of the insulator film transformed into a conductive material is carried out by making the probe, which is grounded beforehand, come in contact with the insulator film directly. The insulator film 35, just like in the above embodiments, is transformed into a conductive material due to the irradiation of the light 8, so that the charged particles of the ion beam 2 are not accumulated in the insulator film; rather, they are ejected up to the grounded portion. After this, the ion beam 2 is scanned on the substrate, thereby detecting the secondary particles ejected from the surface of the substrate using the secondary particle detectors and observing the scanning ion image.

The position of the defect 22 of the TAFT substrate is detected from this scanning ion image, and an area where the ion beam 2 is to be irradiated is set. The ion beam 2 is then irradiated only on the defect portion, thereby removing or correcting the. defect. The wavelength of the light 8 for exciting the electrons in the object insulator must be a wavelength that can excite the transparent substrate provided with insulation properties. Instead of the reflecting mirror 9 mounted on the probe 34, however, the probe 34 itself may be provided with reflecting properties by using, for example, aluminum as the material of the probe 34. If the subject charged beam irradiating apparatus is provided with a nozzle, the nozzle may be used to ground and reflect the charged particles in the insulator instead of the probe.

<Seventh Embodiment>

Figure 7A:
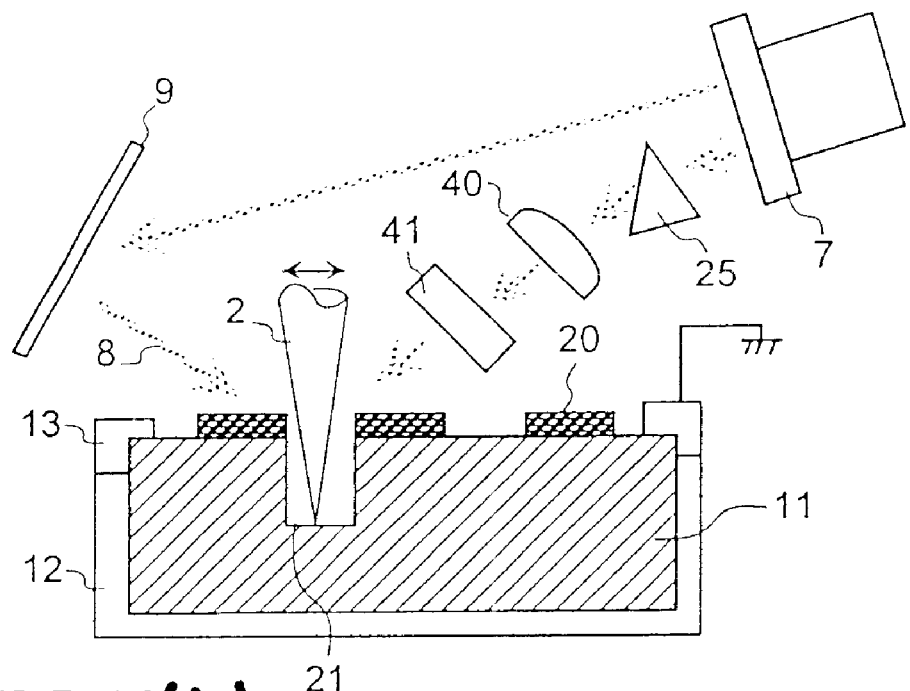
FIG. 7(a) is a schematic front cross sectional view of a sample and the area around the sample in an apparatus employing the grounding method in accordance with the seventh embodiment of the present invention.
Figure 7B:
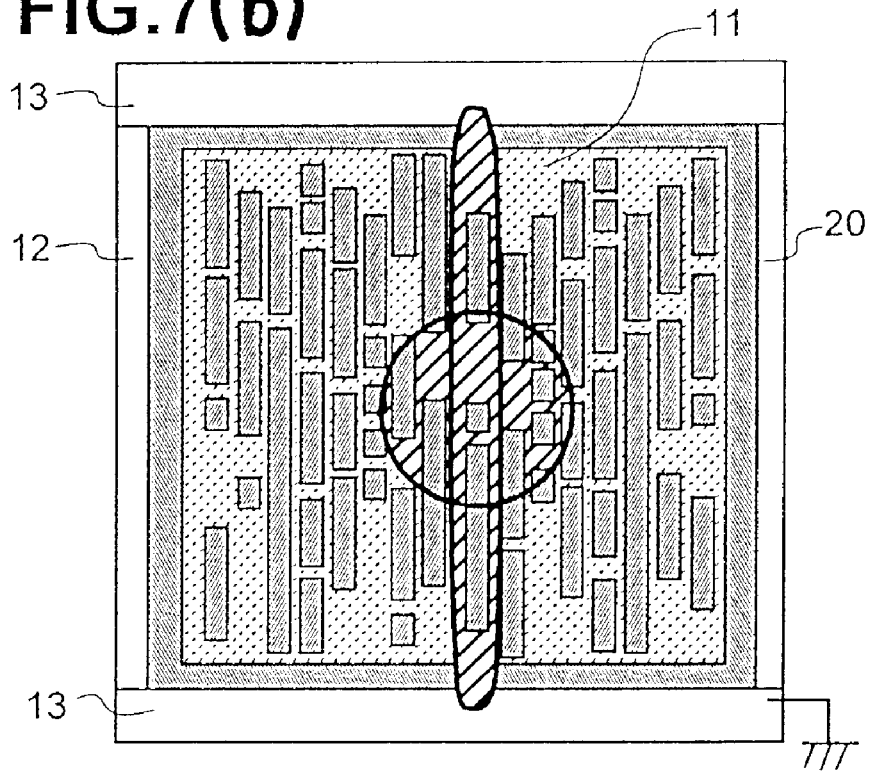
FIG. 7(b) is a top view of the sample.

The seventh embodiment of the present invention involves a method of grounding a substrate provided with insulation properties, which is transformed into a conductive material, as in the above embodiments. Hereunder, the grounding method is realized with a belt-like light for exciting the electrons in the insulator formed on the object substrate, as will be described with reference to FIG. 7(*a*) and FIG. 7(*b*). In FIG. 7(*a*), numeral 40 denotes a flat cylindrical convex lens and 41 denotes a flat cylindrical concave lens. When observing and processing a phase shifting mask at a portion thereof which is close to the outside edge of the substrate, the portion can be grounded by irradiating the light 8 up to the substrate holder, but it is difficult to ground isolated patterns in the center portion of the phase shifting mask. The two cylindrical lenses are used to solve such a problem.

At first, part of the light 8 enters the prism 25 and the rest of the light 8 is directed to the reflecting mirror 9. The light 8 reflected by the reflecting mirror 9 is then irradiated in the charged beam irradiation area. The light 8 which enters the prism 25 is deflected and its irradiation area is expanded in a single axial direction by both flat convex cylindrical lens 40 and flat concave cylindrical lens 41 (FIG. 7(*b*)) so as to effect grounding. The belt-like light 8, whose irradiation area is expanded by these two cylindrical lenses, is irradiated in the charged beam irradiation area from a direction different from that of the light coming from the reflecting mirror 9. Since the insulator formed on the transparent substrate 11 provided with insulation properties is transformed into a conductive material due to the irradiation of the light 8, just like in the above embodiments, the charged particles of the irradiated charged beam 2 are not accumulated in the insulator; rather, they are ejected up to the grounded portion.

After the particles are grounded as described above, the charged beam 2 is irradiated for scanning the substrate and detecting the secondary electrons or ions ejected therefrom using secondary particle detectors, thereby observing and processing the surface of the object substrate. In addition, the lenses 40 and 41 for deflecting the light 8 should be drivingly structured as needed so that a grounded conductive film can be selected. Although the irradiation area is expanded only in the single axial direction in this embodiment, the irradiation area may be expanded radially in multi-axial directions.

<Eighth Embodiment>

Figure 8:
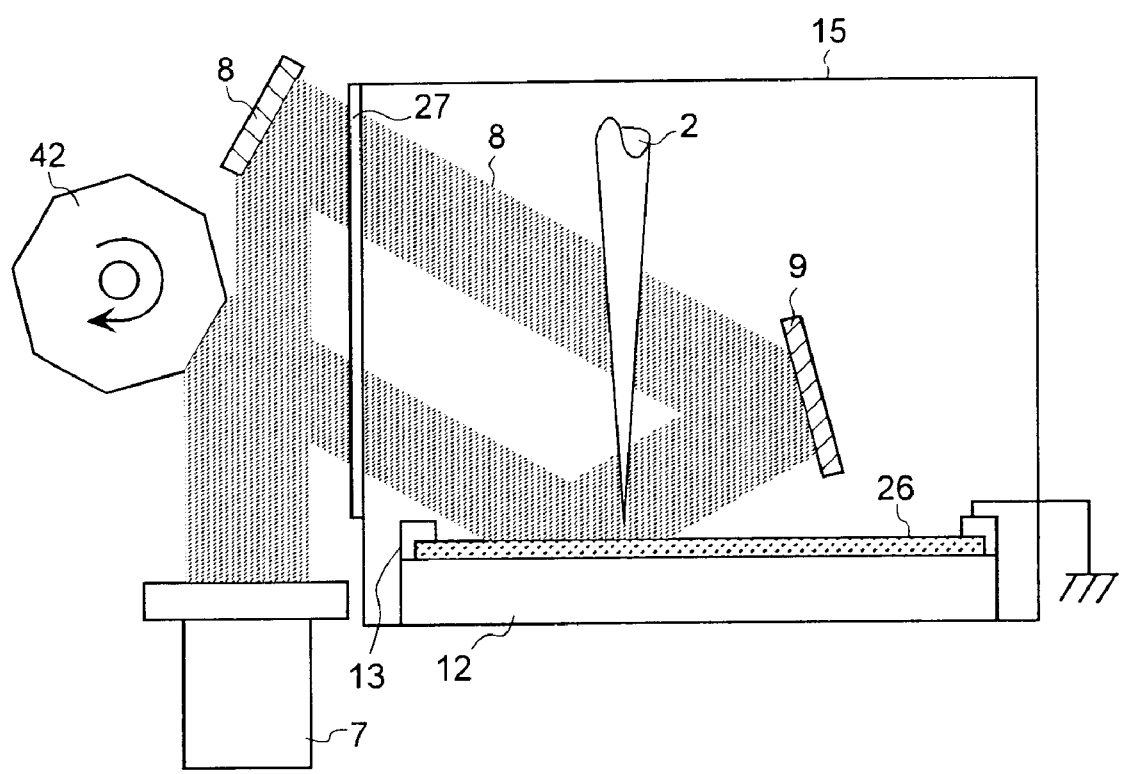
FIG. 8 is a schematic front cross sectional view of a sample and the area around the sample in an apparatus employing the grounding method in accordance with the eighth embodiment of the present invention.

The eighth embodiment of the present invention involves a method of grounding a sample having insulation properties, whose surface insulator is transformed into a conductive material, just like in the above embodiments. Hereunder, the grounding method carried out by scanning the light 8 for exciting the electrons in the object insulator will be described with reference to FIG. 8. In FIG. 8, numeral 42 denotes a rotary polygonal reflecting mirror. When observing and processing the sample having insulation properties, whose surface is covered by an insulator film, at a portion close to the outside edge of the substrate, as in the seventh embodiment, the portion can be grounded by irradiating the light 8 up to the grounded substrate holder. However, it is difficult to ground the center area covered by an insulator film. This polygonal reflecting mirror 42 is thus used to solve this problem.

At first, part of the light 8 for exciting the electrons in the object insulator is directed to the polygonal reflecting mirror 42 and the rest of the light 8 is directed to the reflecting mirror 9. The light 8 reflected by the reflecting mirror 9 passes through the light transmission substance 27, and then it is reflected again by the reflecting mirror 9 and irradiated onto the charged beam irradiation area. On the other hand, the light reflected by the polygonal reflecting mirror 42 is irradiated onto the charged beam irradiation area from a direction different from that of the light reflected by the reflecting mirror 9. The polygonal reflecting mirror 42, when rotated, allows the light 8 to scan an area ranged from the charged beam irradiation area to a grounding area, thereby ejecting charged particles therefrom.

Since the surface of the sample 26 having insulation properties is transformed into a conductive material in response to irradiation by the light 8. as in the above embodiments, the charged particles of the irradiated charged beam 2 are not accumulated in the insulator; rather, they are ejected up to the grounded portion due to the scanning of the light from the polygonal reflecting mirror 42. After the charged particles are grounded in this way, the focused charged beam 2 is scanned on the substrate, thereby allowing the secondary electrons or ions ejected from the substrate to be detected by the secondary particle detectors. It is thus possible to observe or process and analyze the surface of the substrate.

<Ninth Embodiment>

Figure 9A:
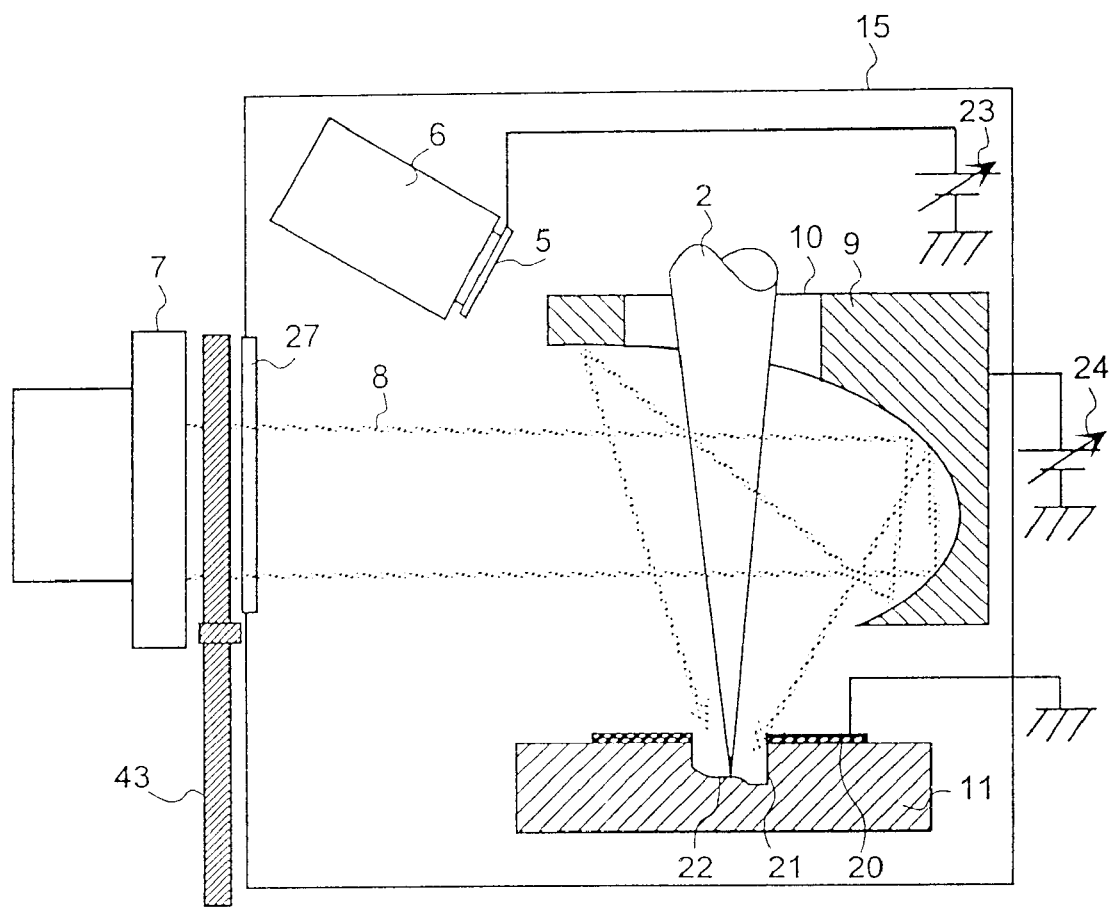
FIG. 9 is a schematic front cross sectional view of a sample and the area around the sample in an apparatus employing the irradiating method in accordance with the ninth embodiment of the present invention.
Figure 9B:
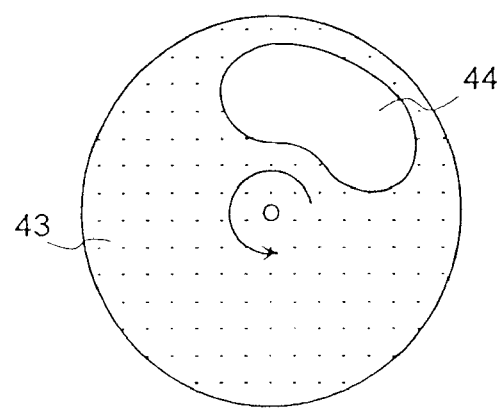

The ninth embodiment of the present invention involves a method of irradiating light in the form of pulses for exciting the electrons in the insulator described in the above embodiments. Hereunder, the light pulse irradiating method will be described with reference to FIGS. 9(*a*) and 9(*b*). In FIG. 9(*b*), numeral 43 denotes a light-proof disc and 44 denotes a hole for passing the object light. The sample to be observed and processed is not to be continuously altered nor processed by the light 8 for exciting the electrons in the object insulator. Especially when a gas is used together with the charged beam, the gas may react with the light 8, thereby accelerating the processing work. This is why the light 8 is irradiated in pulses in this embodiment, thereby transforming the insulator into a conductive material, as well as protecting the surface of the substrate from damage as much as possible.

In order to irradiate the light 8 for exciting the electrons in the object insulator in a pulse-like manner, the light-proof disc 43 provided with a light transmission hole 44 is rotated in the light path between the light source 7 and the substrate. According to this method, only when the light-passing hole 44 is aligned with the light axis will the light 8 be irradiated; and, the light 8 is blocked in other cases. And, the irradiation time is determined by the size of the light transmission hole 44 provided for the light-proof disc 43, so that the minimum necessary time for transforming the insulator into a conductive material can be set. The surface of the object substrate can thus be observed, and processed/corrected as needed just like in the above embodiments. In order to generate such light pulses, the light source also may be controlled by a clock signal.

The method for irradiating the light 8 in a pulse-like manner can also be applied to the first to eighth embodiments described above. If the method is applied to any of those embodiments, it is possible to reduce the influence of the irradiation of the light 8 on the detection of secondary electrons by shifting the timing for irradiating the ion beam on a sample from the timing for irradiating the pulsed light 8, thereby avoiding simultaneous irradiation of both the ion beam and light 8.

The charged beam irradiating apparatus according to the above embodiments may be a focused ion beam irradiating apparatus, a scanning electron microscope, an Auger electron spectroscope, an IMA (Ion Microprobe Analyzer), and an SIMS (Secondary Ion Mass Spectrometry), for example.

What is claimed is:

1. A method of observing or processing and analyzing the surface of a sample using a charged beam, comprising the steps of:
   irradiating said charged beam on the surface of a sample covered at least partially by an insulator film;
   irradiating light only to a portion of the surface of the sample exciting the electrons in a material composing said insulator film in an area including a charged beam irradiation portion on the surface of said sample;
   detecting secondary particles generated from the surface of said sample by irradiating said charged beam on the surface of said sample; and
   observing, processing, or analyzing the surface of said sample according to the information of said detected secondary particles.

2. A method of observing or processing and analyzing the surface of a sample in accordance with claim 1, wherein
   the timing of said step for irradiating said charged beam on the surface of a sample is set differently from the timing of said step for exciting the electrons in said insulator by irradiating said light.

3. A method of observing or processing and analyzing the surface of a sample in accordance with claim 1, wherein
   said light is an ultraviolet light.

4. A method of observing or processing and analyzing the surface of a sample in accordance with claim 1, wherein
   said ultraviolet light is irradiated from a plurality of directions.

5. A method of observing or processing and analyzing the surface of a sample in accordance with claim 1, wherein
   said ultraviolet light is irradiated in an area including a grounded conductor.

6. A method of observing or processing and analyzing the surface of a sample in accordance with claim 1, wherein
   the wavelength of said ultraviolet light is 150 nm or under.

7. A method of observing or processing and analyzing the surface of a sample using a charged beam, comprising the steps of:
   placing a sample on a sample stage provided in a sample chamber, said sample being covered at least partially by an insulator film;
   irradiating said charged beam on the surface of said sample while said sample is placed on said sample stage and said sample chamber is evacuated;
   irradiating light only to a portion of the surface of said sample in an area ranged from a charged beam irradiation portion on the surface of said sample to the surface of a member grounded in said sample chamber, said light operating to excite the electrons in a material composing said insulator film;
   detecting secondary particles generated from the surface of said sample by irradiating said charged beam on the surface of said sample; and
   observing, processing, or analyzing the surface of said sample according to the information of said detected secondary particles.

8. A method of observing or processing and analyzing the surface of a sample in accordance with claim 7, wherein
   said light is an ultraviolet light.

9. A method of observing or processing and analyzing the surface of a sample in accordance with claim 7, wherein
   said ultraviolet light is irradiated from a plurality of directions.

10. A method for observing or processing and analyzing the surface of a sample in accordance with claim 7, wherein
    the wavelength of said ultraviolet light is 150 nm or under.

11. An apparatus for observing or processing and analyzing the surface of a sample using a charged beam, comprising:
    a charged beam source for emitting a charged beam;
    a focusing optical system for focusing a charged beam emitted from said charged beam source, thereby irradiating a focused beam on said sample;
    a stage for holding said sample thereon;
    secondary particle detecting means for detecting secondary particles generated from said sample by irradiating said charged beam focused by said focusing optical system on said sample; and
    irradiating means for irradiating an ultraviolet light only to a portion of on the surface of said sample.

12. An apparatus for observing or processing and analyzing the surface of a sample using a charged beam in accordance with claim 11, wherein
    said irradiating means irradiates an ultraviolet light on the surface of said sample from the same axial direction as that of said focusing optical system means.

13. An apparatus for observing or processing and analyzing the surface of a sample using a charged beam in accordance with claim 11, wherein
    said irradiating means irradiates said ultraviolet light on the surface of said sample from a plurality of directions.

14. An apparatus for observing or processing and analyzing the surface of a sample using a charged beam in accordance with claim 11, wherein
    said charged beam source emits an electron beam or an ion beam.

15. An apparatus for observing or processing and analyzing the surface of a sample using a charged beam in accordance with claim 11, wherein
    said apparatus observes, processes, or analyzes the surface of said sample by irradiating said focused charged beam on the surface of said sample.

16. An apparatus for observing or processing and analyzing the surface of a sample using a charged beam, comprising:

a sample chamber provided with a sample stage for holding a sample therein;

evacuating means for evacuating said sample chamber;

a charged beam source for emitting a charged beam;

a focusing optical system for focusing said charged beam emitted from said charged beam source and irradiating a focused charged beam on the surface of said sample placed on said sample stage;

secondary particle detecting means for detecting secondary particles generated from said sample by irradiating said charged beam focused by said focusing optical system on said sample; and ultraviolet light irradiating means for irradiating an ultraviolet light only to a portion of the surface of said sample in a charged beam irradiation area ranged from a charged beam irradiation portion on the surface of said sample to the surface of a member grounded in said sample chamber.

17. An apparatus for observing or processing and analyzing the surface of a sample using a charged beam in accordance with claim 16, wherein said irradiating means irradiates said ultraviolet light on the surface of said sample from the same axial direction as that of said focusing optical system means.

18. An apparatus for observing or processing and analyzing the surface of a sample using a charged beam in accordance with claim 16, wherein said irradiating means irradiates said ultraviolet light on the surface of said sample from a plurality of directions.

19. An apparatus for observing or processing and analyzing the surface of a sample using a charged beam in accordance with claim 16, wherein said charged beam source emits an electron beam or an ion beam.

20. An apparatus for observing or processing and analyzing the surface of a sample using a charged beam in accordance with claim 16, wherein said apparatus observes, processes, or analyzes the surface of said sample by irradiating said focused charged beam on the surface of said sample.

21. A method of observing or processing and analyzing the surface of a sample in accordance with one of claims 1 to 10, wherein said light is irradiated in the form of pulses.

22. An apparatus for observing or processing and analyzing the surface of a sample in accordance with one of claims 11 to 20, wherein said irradiating means produces light in the form of pulses.

* * * * *